United States Patent [19]
Ng

[11] Patent Number: 5,367,500
[45] Date of Patent: Nov. 22, 1994

[54] TRANSDUCER STRUCTURE

[75] Inventor: Kin W. Ng, Laurel, Md.

[73] Assignee: The United States of America as represented by the Secretary of the Navy, Washington, D.C.

[21] Appl. No.: 953,621

[22] Filed: Sep. 30, 1992

[51] Int. Cl.$^5$ ............... H04R 17/00; H01L 41/04
[52] U.S. Cl. .................... 367/157; 310/328; 310/800
[58] Field of Search ........... 367/157; 310/311, 357, 310/366, 325, 337, 328, 800, 340, 332, 334

[56] References Cited

U.S. PATENT DOCUMENTS

| | | | |
|---|---|---|---|
| 4,510,412 | 4/1985 | Suda et al. | 310/328 |
| 4,633,120 | 12/1986 | Sato et al. | 310/328 |
| 4,759,107 | 7/1988 | Ogawa et al. | 310/328 |
| 5,153,859 | 10/1992 | Chatigny et al. | 367/157 |

FOREIGN PATENT DOCUMENTS

| | | | |
|---|---|---|---|
| 0190883 | 9/1985 | Japan | 367/157 |
| 9206511 | 4/1992 | WIPO | 310/311 |

*Primary Examiner*—Ian J. Lobo
*Attorney, Agent, or Firm*—George A. Kap; Thomas E. McDonnell

[57] ABSTRACT

A flexible three-layer transducer wherein the layers are vertically stacked and are coextensive with each other, the middle layer having twice the thickness of any one of the outer layers, and electrodes between and on the outside surface of the layers for conveying signals from the layers, said layers are made from PVDF or flexible piezoceramic sheets.

17 Claims, 1 Drawing Sheet

TRANSDUCER STRUCTURE

FIELD OF INVENTION

This invention pertains to construction of a transducer. More specifically, this invention pertains to an underwater transducer which can be used to sense and generate acoustic signals.

DESCRIPTION OF PRIOR ART

It is known that several transducers can be connected electrically and/or mechanically to form one hydrophone with better sensitivity than that of the individual hydrophone or to form a driver with better efficiency than that of the individual driver. The simplest arrangement for a hydrophone, using N identical elements connected electrically in series, has an ideal sensitivity which is N times that of a single element. The same principle may be reversed to produce multiple-element drivers with improved output efficiency. For use as a driver, the same N elements may be connected electrically in parallel to form a single element with an ideal efficiency which is N times that of a single element. In practice, multiple-element transducer designs reflect the optimum hydrophone/driver performance desired and embody the electrical and mechanical limitations of the piezoelectric materials.

Commercial multiple element hydrophones are typically made from one of the compositions of lead-zirconate-titanate (PZT). The production process has many steps, starting with the production of single layer elements and concluding with the assembly of multiple elements into properly connected and insulated sandwiches. These are generally encapsulated in a waterproof material and encased in a metal housing for protection against mechanical damage. Hydrophones of this type are robust and reliable.

In some underwater applications where unobtrusive measurement near or on the surface of targets is desired, multiple element hydrophones have also been made from polyvinylidene difluoride (PVDF) and flexible piezoceramic sheets, both available commercially. The advantages of hydrophones made from these materials over those made from PZT are threefold: they are less obtrusive, they can conform to simple target shapes, and they can provide area-averaged pressure over a larger target area. Fabrication of these hydrophones follows similar procedures, but is made more complicated because of the relatively more fragile nature of the piezoelectric elements.

Fabrication method of commercial transducers begins with the individual elements, each of which has its own set of electrodes and electrical leads. Depending on the design, each element may be encapsulated individually in a material such as polyurethane, which may serve as both an electrical insulator and as a water-proof coating. In the flexible transducers, fragility of the electrical connections has proved to be a major weakness: experience in the laboratory has shown that failure or poor performance can often be traced directly to a broken or deteriorating connection.

The next step in the method is the assembly of the elements. These must be assembled such that their piezoelectric polarization follow a specific pattern and the electrical leads must be connected in a specific pattern as well; any error in either pattern would impair the transducer's performance or render it inoperable. At the same time, the elements must be kept in alignment with each other; misalignment degrades the total performance. This has proved to be difficult to maintain in laboratory production but should not be a problem for industrial production where a positive alignment means would be provided.

Continuing with the method, the elements are physically attached to each other by means of a bonding layer and encapsulated. Current practice uses polyurethane as the bonding, insulating, and water-proofing material for individual elements and the transducer assembly.

Typical thicknesses for commercially available PVDF sheets are one, two, and four mils (one mil equals 0.001 inch). However, with the additional components, the overall thickness becomes appreciable. As the number of layers increases, so does the total thickness, which may negate the advantage of unobtrusive characteristic of this type of transducer.

A prior art four-layer transducer is shown in FIG. 1. Such a transducer includes a top piezoelectric layer 10 and lower piezoelectric layer 12 having their piezoelectric polarization in opposite directions. Between layers 10 and 12 is a thin bonding layer 24 of epoxy which attaches the two layers mechanically. Electrodes 27, 11, 22, and 26 are disposed on opposing sides of the layers and are in direct contact therewith. The layers, the electrodes, and the intervening epoxy layer, are potted in protective polyurethane coating or cover 19. The lower half of the prior art transducer is fabricated in polyurethane potting compound 39, as shown.

All of the layers, electrodes, intervening epoxy layers, and the polyurethane potting are disposed in polyurethane compartment 25 which houses the four-layer transducer. Leads 31, 29, 18, 33, 30, and 36 are connected to the respective electrodes, as shown, and are grounded electrically. Electrical leads 29 and 30 are disposed between electrodes 11, 22, and 13, 14 and are in electrical contact therewith. In addition, electrodes 27, 26 and electrodes 17, 28 are connected together electrically along the edges by means of a conductive tape 53 and 55, as shown. These tapes may be metallized mylar film or some other thin conductive film, provided that they do not contact the middle electrodes 11, 22, 13 and 14. The grounded envelopes provided by the electrodes 27 and 26 and the conductive tape 53, and by the electrodes 17 and 28 and tape 55, help to reduce electromagnetic interference from spurious signals.

Used as a hydrophone, the prior art transducer illustrated in FIG. 1 would have leads 29 and 30 connected to the inputs of a differential amplifier while, if the transducer of FIG. 1 were to be used as a driver, these leads would be connected to the outputs of a power amplifier. Used as a hydrophone, this transducer would have a theoretical sensitivity twice that of a single-layer hydrophone, and, used as a driver, a theoretical power output four times that of a single-layer driver.

SUMMARY OF INVENTION

It is an object of this invention to make a three-layer transducer.

It is another object of this invention to make a novel transducer which, when compared to the prior art transducers, is simpler in construction, has fewer electrical connections, has improved ruggedness, and is thinner in profile.

It is another object of this invention to make a three-layer transducer which can be used either as a hydrophone to sense acoustical signals or as a driver to send acoustical signals.

These and other objects of the invention disclosed herein are accomplished by a three-layer transducer which is characterized by a pair of outer piezoelectric layers of identical area and thickness and with their piezoelectric polarization in parallel and an inner piezoelectric layer which has the same area but twice the thickness of any one of the outer layers and its piezoelectric polarization 180° opposite to those of the outer layers. Electrodes are disposed on opposite sides of each layer and are in direct contact therewith. The piezoelectric layers are aligned and attached physically to one another by means of thin bonding layers. The outer electrodes are grounded together electrically and the inner electrodes are connected to either the inputs of a differential amplifier for sensing acoustical signals when used as a hydrophone or to the outputs of a power amplifier for sending acoustical signals when used as a driver.

DETAILED DESCRIPTION OF INVENTION

This invention is directed to a three-layer transducer which can be used as a hydrophone to sense acoustical signals or as a driver to send acoustical signals, depending on how it is connected.

Although the three-layer transducer of this invention can be equivalent to a prior art four-layer transducer in that the transducers have identical theoretical performances, this invention has a number of advantages over the prior art four-layer design. While the detrimental effect of the electrical connections and mechanical robustness of the elements in both transducers are the same, the simpler design of the transducer of this invention requires fewer elements and electrical connections and leads to a simpler manufacturing process which produces a more reproducible and a more rugged transducer. At the same time, a thinner and therefore less obtrusive transducer is achieved without sacrificing performance.

The transducer of this invention comprises three stacked coextensive layers of piezoelectric material, with two outer layers and one middle layer. The two outer layers are of the same thickness whereas the middle layer is twice as thick as either one of the outer layers. The thickness of the middle layer of the three-layer transducer is equivalent to the thickness of the two inner layers of the prior art four-layer transducer, assuming equivalent performance, due to the fact that thickness of piezoelectric material is directly proportional to the output signal. This means that a thicker section will respond to the induced pressure to yield a larger electrical signal.

Figure 2:
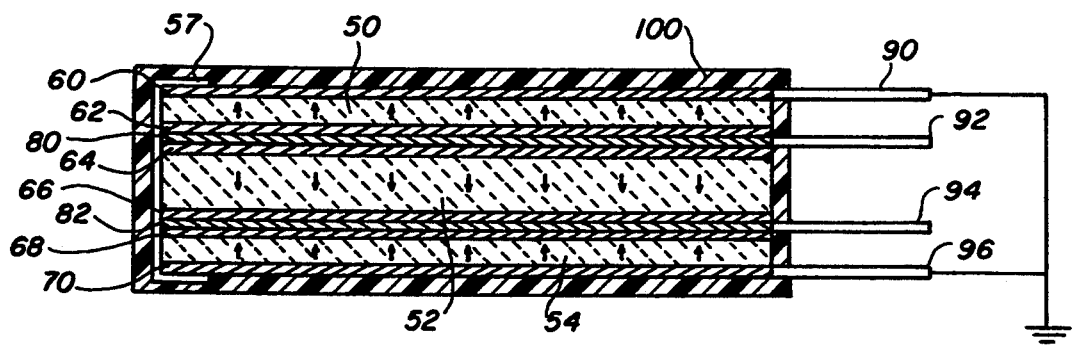
FIG. 2 is an illustration of the novel three-layer transducer of this invention which is characterized by two outer layers and one inner layer disposed between the two outer layer; the inner layer is twice as thick as any one of the outer layers.

The novel transducer of this invention is shown in FIG. 2, which illustrates the transducer composed of outer piezoelectric layer 50, inner piezoelectric layer 52, and another outer piezoelectric layer 54. The inner layer 52 is disposed between outer layers 50 and 54. The layers are stacked one on top of the other and have commensurate length and width, i.e., they are coextensive. Although the inner layer has the same length and width as the outer layers 50 and 54, its thickness should be twice that of either outer layer 50 or 54 and its volume is, therefore, twice that of either layer 50 or 54. If the thickness is not twice that of either the upper or lower layers, then operation of the transducer will be degraded generally in proportion to the degree it is not that. In addition, the piezoelectric polarizations of the outer layers 50 and 54 must be parallel to one another and opposite to that of the inner layer 52.

The layers are in direct contact with electrodes along their largest surface areas. Electrode 60 is in direct contact with the entire upper surface of layer 50, and electrode 62 is in contact with the lower surface or opposite side of layer 50. Electrodes 64 and 66 are in contact with the upper and lower surfaces, respectively, of layer 52. Layer 54 is in contact along its upper surface with electrode 68 and along its entire lower surface with electrode 70. In addition, electrodes 60 and 70 are connected electrically together along the edges by means of a conductive tape 57, care being taken that this tape does not contact electrodes 62, 64, 66 and 68. The grounded envelop provided by the electrodes 60 and 70 and the conductive tape 57 helps to reduce electromagnetic interference from spurious signals.

The electrodes 60 and 70 are coextensive with the entire upper surface of layer 50 and the entire lower surface of layer 54, respectively. Electrodes 62, 64, 66 and 68 may be smaller and be shaped differently from electrodes 60 and 70, depending on the application, as long as they have identical patterns and are aligned with each other.

Each electrode is disposed on the surface of a piezoelectric layer in the form of a conductive foil, film or very thin layer. Typically, the electrodes are deposited on the piezoelectric layer by means of vapor deposition or by silk screening.

Layers 50 and 52 are attached together mechanically by means of a thin bonding layer 80, and, similarly, layers 52 and 54 by bonding layer 82. The bonding layers 80 and 82 may be from 0.01 to 0.1 inches in thickness, depending on design requirements, and are preferably made from epoxy resin. A typical epoxy is #321S Epoxy Resin from RBC Industries.

Electrical lead 90 is connected to electrode 60 on its upper surface thereof, as shown in FIG. 2, lead 92 to electrodes 62 and 64, lead 94 to electrodes 66 and 68, and lead 96 to electrode 70 on its lower surface thereof. As is clearly illustrated in FIG. 2, the electrical leads, for convenience, are all arranged at the right side of the transducer.

As shown in FIG. 2, the transducer layers with the accompanying electrodes and bonding layers are potted in a suitable inert material, such as polyurethane 100, for water-proofing.

In operation, leads 90 and 96 are grounded electrically. When the transducer is used as a hydrophone, leads 92 and 94 are connected to the inputs of a differential amplifier, and when it is used as a driver, these leads are connected to the outputs of a power amplifier.

The piezoelectric layers 50, 52 and 54 can be made from any piezoelectrically active material. More specifically, such materials include the various PZT compositions, PVDF homopolymers and copolymers, commercially available flexible piezoceramic sheets, lead titanate (PbTiO$_3$), and barium titanate (BaTiO$_3$). The choice of material would depend on the application.

If flexibility in the transducer is needed or desired, the preferred materials are PVDF homopolymer and copolymer and the flexible piezoceramic sheets which consist of PZT powder suspended in an elastomer matrix.

If the transducer is to be used as a hydrophone, PVDF homopolymer or copolymer would be the materials of choice because of their superior piezoelectric properties for this application. The piezo stress constant $g_{33}$ of PVDF homopolymer has a value of 0.339 V-m/N, compared to a value of 0.151 V-m/N for a flexible piezoceramic, and 0.026 V-m/N for a PZT material. Using one and two mil thick sheets of PVDF homopolymer, which is less expensive than PVDF copolymer, of area 1.49 m$^2$, a sensitivity of approximately $-200$ dB referenced to 1 Volt/$\mu$Pa at 100 Hz has been achieved in the laboratory.

On the other hand, if the transducer is to be used as a driver, the flexible piezoceramic would be the material of choice. Its piezo strain constant $d_{33}$ has a value of $60 \times 10^{-12}$ m/Volt, compared to a value of $33 \times 10^{-12}$ m/Volt for PVDF homopolymer. If flexibility is not an issue, then a PZT material would be the material of choice with a much higher $d_{33}$ value of $374 \times 10^{-12}$ m/Volt. Using six layers of 1.1 mm thick flexible piezoceramic, a driver efficiency of 120 dB referenced to 1 $\mu$Pa/Volt at 100 Hz has been achieved in the laboratory. The flexible piezoceramic material is commercially available from NTK, a Japanese firm, whereas the PZT material is widely commercially available.

There are no restrictions on the length and width dimensions of the transducer layers, except that imposed by manufacturing processes. Commercially available PVDF sheets in widths of 12 to 14 inches are readily available, and commercially available flexible piezoceramics in the form of 5 inch by 5 inch squares are also available. Small sheets may be joined together to form larger ones. On the thickness of the layers, it is required that the two outer layers have the same thickness and that the middle layer has a thickness twice that of either of the outer layers. Generally speaking, however, surface dimensions of the outer layers should be in the range of 0.1–50 inches by 0.01–10 inches, preferably 1–20 inches by 0.1–5 inches, with a thickness of 0.01–20 mils, preferably 0.1–10 mils. Although flexible piezoelectric materials for the layers are used, rigid materials can also be used without affecting performance thereof except possibly the unobstrusive nature of the transducers.

Figure 1:
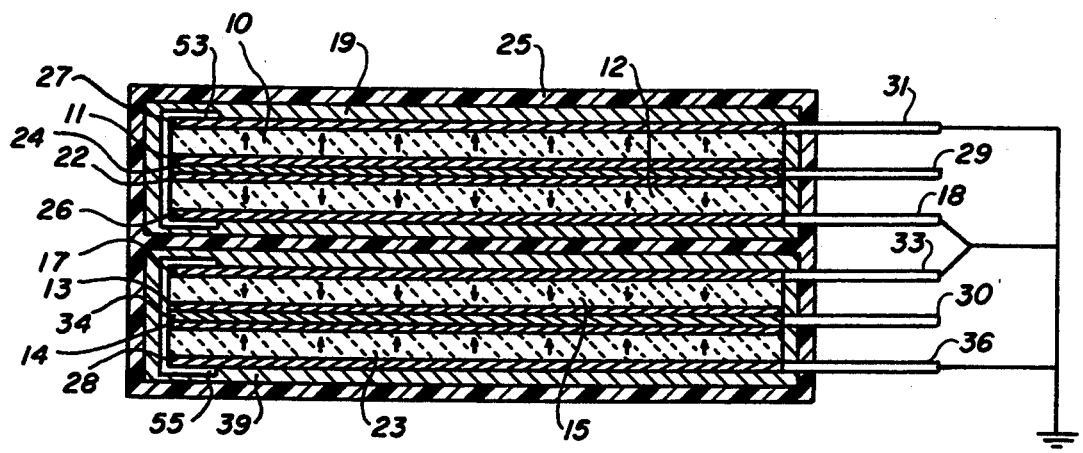
FIG. 1 is an illustration of the prior art four-layer transducer having four piezoelectric layers of equal dimensions.

Comparing the prior art and the transducer of the invention herein, the equivalent four-layer transducer of FIG. 1 has an additional active piezoelectric layer 15 and two additional electrodes 26 and 17 which are connected together electrically and grounded via leads 18 and 33. In addition, each pair of layers of the prior art transducer are potted separately in polyurethane 39 as an intermediate step in the assembly. Theoretically, the transducers of FIGS. 1 and 2 have a sensitivity twice that of a single-layer hydrophone, when used as a hydrophone, and four times the power output of a single-layer driver, when used as a driver.

The novel three-layer transducer shown in FIG. 2 can be made by precutting the transducer layers to the desired size. For purposes herein, the transducer layers are cut from PVDF homopolymer sheets which come in sheet form of 10 inch length, 5 inch width, and 2 mil and 4 mil thicknesses. The layers are cut to the desired dimension with a tongue which acts as an electrical lead and strain-relief when the transducer is assembled.

Electrode patterns are applied to both sides of the piezoelectric layer by either vapor deposition or silk-screening. The vapor deposited electrodes typically are on the order of 10 to 100 angstroms thick and are silver, gold, or some other conductive metal. Silk-screened electrodes tend to be thicker, on the order of 0.1 to 0.2 mil, using conductive paints containing metal powder, typically copper or silver. The uniformity of the electrode layer thickness is more important than the actual thickness. To provide strain-relief, the electrode pattern includes leads extending to the tongue described previously for external electrical connection. Although FIG. 2 shows electrical leads 90, 92, 94 and 96 as separate elements at the edge of the electrodes, these connections may be made at any point on the electrode layer; in most cases, these connections are made to extensions of the electrode pattern in the tongue.

In a specific embodiment, the thickness of layers 50 and 54 was 2 mils and the thickness of layer 52 was 4 mils. The active area of layers 50, 52 and 54 were all 5 inches long and 1 inch wide, with a tongue 1 inch long and 0.5 inch wide at one end for electrical connection.

An alternative method to connect two layers mechanically and electrically is to apply a thin layer of conductive epoxy between adjacent piezoelectric layers. This method reduces the need to make separate mechanical bond and electrical connection between the two layers. The novel three-layer transducer can be made by omitting one of the electrodes 62 and 64 and one of the electrodes 66 and 68. In this case, the bonding layers 80 and 82 must be made from conductive epoxy.

The novel three-layer transducer of this invention shown in FIG. 2 has advantages over the prior art four-layer transducer shown in FIG. 1 which include simpler construction, fewer electrical connections, improved ruggedness, and thinner profile. By replacing the two middle layers 12 and 15 in the prior art four-layer transducer by a single layer 52 in the three-layer transducer, there are fewer components to prepare and assemble accurately. In the novel transducer, one interface is eliminated which translates into elimination of two electrodes 26 and 17, two electrical leads 18 and 28, and one bonding layer between layers 12 and 15. With fewer components and electrical connections, undesirable circuital losses are reduced and the novel transducer's performance is closer to the designed level. At the same time, with fewer components, the three-layer transducer is inherently more rugged and thinner than the four-layer one.

What is claimed is:

1. An electrical device consisting essentially of three layers of piezoelectric material and electrical means in association with said layers for conveying a signal from each of said layers wherein said layers are stacked on top of each other with two outer layers and one middle layer, said middle layer has twice the thickness of any one of said outer layers and al three layers have face surfaces that are defined by length and width dimensions of said layers.

2. A device of claim 1 wherein said layers are coextensive with each other and wherein said electrical means are positioned between and outside of said layers, said electrical means contacting said layers and extending outwardly thereof.

3. A device of claim 2 including an epoxy binder between said electrical means and between said layers for attaching said layers mechanically to each other, said two outer layers having polarization in the same direction and said middle layer having polarization in the opposite direction from polarization of said two outer layers.

4. A device of claim 3 wherein said layers are in the form of sheets and said binder is electrically conductive said device including electrodes electrically connected to both sides of said binder wherein each electrode is in contact with at least a substantial portion of the surface of respective layer.

5. A device of claim 4 including a polyurethane protective layer around said device and an amplifier, wherein said electrical means is electrically connected to the outer face surface of each of said two outer layers which electrodes are grounded and wherein remaining electrodes are connected to said amplifier.

6. A device of claim 5 wherein dimensions of said layers are in the range of about 0.1–50 inches×0.01–10 inches×0.01–20 mils, said electrode thickness is generally 0.1 to 0.2 mils, and said binder thickness is generally 0.01 to 0.1 inches.

7. A device of claim 5 wherein thickness of said middle layer is in the range of about 0.01 to 20 mils.

8. A device of claim 5 wherein dimensions of said outer layers are about 1–20 inches×0.1×5 inches×0.1–10 mils, said middle layer has the same dimensions as said outer layers except its thickness is twice that of any one of said outer layers.

9. A device of claim 6 including a polyurethane protective cover enveloping and waterproofing said device, said protective cover has thickness in the range 0.01 to 0.5 of mils.

10. A device of claim 9 wherein said layers are made of a piezoelectric material selected from the group consisting of PVDF, PZT, and mixtures thereof.

11. Transducer consisting essentially of two outer and one middle vertically stacked coextensive layers of piezoelectric materials, and electrodes associated with said layers for conveying signals from each of said layers, said middle layer having twice the thickness of any one of said outer layers.

12. A transducer of claim 1 wherein said electrodes are positioned between and outside of said layers and are in contact with said layers.

13. A transducer of claim 12 wherein said layers are in the form of sheets and said outer layers are of the same thickness, and wherein said transducer includes a binder between said electrodes and between said layers for attaching said layers mechanically to each other.

14. A transducer of claim 13 wherein each of said layers has outer and inner faces, wherein an electrode is electrically connected to the outer face of said outer layers which electrodes are grounded and wherein remaining electrodes are connected to an external amplifier.

15. A transducer of claim 14 including a protective cover over said transducer for water-proofing said transducer; said layers are made from a piezoelectric material selected from the group consisting essentially of PVDF, PZC and mixtures thereof; said outer layers have dimensions in the range of 1–20 inches by 0.15 inches by 0.1–10 mils in thickness, said middle layer has the same dimensions as said outer layers except thickness which is twice that of any one of said outer layers, thickness of each of said electrodes is 0.01 to 0.1 mils, and said binder has thickness of 0.01 to 0.1 inches.

16. An electrical device comprising a stack of piezoelectric layers containing a middle layer and two outer layers on either side of said middle layer and an electrically conductive surface disposed between each of said layers for providing electrical contact between adjoining layers, said middle layer having the same dimensions as said outer layers except its thickness is twice that of one of said outer layers, said middle and outer layers being in the form of sheets, said two outer layers having about the same thickness and having dimensions of about 1–20 inches by about 0.1–5 inches by about 0.1–10 mils in thickness, said outer layers being polarized in the same direction, and said middle layer being polarized in a direction opposite from the direction in which said outer layers are polarized.

17. Device of claim 16 wherein said layers are made of a piezoelectric material selected from the group consisting of PVDF, PZT, and mixtures thereof.

* * * * *